US012696480B2

(12) United States Patent
Suzuki

(10) Patent No.: US 12,696,480 B2
(45) Date of Patent: Jul. 28, 2026

(54) SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Ryota Suzuki, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 397 days.

(21) Appl. No.: 18/471,581

(22) Filed: Sep. 21, 2023

(65) Prior Publication Data

US 2024/0170567 A1    May 23, 2024

(30) Foreign Application Priority Data

Nov. 18, 2022    (JP) ................................. 2022-184657

(51) Int. Cl.
| | |
|---|---|
| *H10D 30/66* | (2025.01) |
| *H10D 62/10* | (2025.01) |
| *H10D 62/832* | (2025.01) |

(52) U.S. Cl.
CPC ......... *H10D 30/665* (2025.01); *H10D 30/668* (2025.01); *H10D 62/107* (2025.01); *H10D 62/8325* (2025.01)

(58) Field of Classification Search
None
See application file for complete search history.

(56) References Cited

U.S. PATENT DOCUMENTS

| | | | | |
|---|---|---|---|---|
| 8,680,613 | B2 * | 3/2014 | Guan ................... | H10D 30/665 |
| | | | | 257/341 |
| 9,478,673 | B2 * | 10/2016 | Aketa ...................... | H10D 8/60 |
| 9,887,287 | B1 * | 2/2018 | Lichtenwalner ..... | H10D 62/126 |
| 2004/0135153 | A1 | 7/2004 | Ryu et al. | |
| 2006/0054895 | A1 | 3/2006 | Ryu et al. | |
| 2006/0118792 | A1 | 6/2006 | Ryu et al. | |
| 2007/0272979 | A1 | 11/2007 | Saito et al. | |
| 2009/0035926 | A1 | 2/2009 | Ryu et al. | |

(Continued)

FOREIGN PATENT DOCUMENTS

WO    WO-2021111528 A1 *    6/2021    ........... H10D 62/128

OTHER PUBLICATIONS

English Translation of WO 2021111528 A1 (Year: 2021).*

*Primary Examiner* — Khaja Ahmad
(74) *Attorney, Agent, or Firm* — Posz Law Group, PLC

(57) ABSTRACT

A semiconductor device includes lower guard rings and upper guard rings. An upper portion of each of the lower guard rings overlaps a lower portion of the corresponding upper guard ring. A lower inner peripheral surface of each of the lower guard rings is offset to one side in a predetermined direction with respect to an upper inner peripheral surface of the corresponding upper guard ring. A lower outer peripheral surface of each of the lower guard rings is offset to the one side in the predetermined direction with respect to an upper outer peripheral surface of the corresponding upper guard ring.

10 Claims, 9 Drawing Sheets

(56)          References Cited

U.S. PATENT DOCUMENTS

| | | | |
|---|---|---|---|
| 2009/0302376 A1* | 12/2009 | Inoue .................. | H10D 62/106 |
| | | | 257/329 |
| 2010/0200936 A1 | 8/2010 | Saito et al. | |
| 2011/0081772 A1 | 4/2011 | Ryu et al. | |
| 2012/0286290 A1 | 11/2012 | Uchida | |
| 2013/0214291 A1 | 8/2013 | Uchida et al. | |
| 2016/0211319 A1* | 7/2016 | Saito .................. | H10D 64/513 |
| 2016/0300904 A1* | 10/2016 | Antoniou ............ | H10D 12/481 |
| 2017/0365669 A1 | 12/2017 | Kim et al. | |
| 2018/0151366 A1* | 5/2018 | Endo ...................... | H10D 30/60 |
| 2022/0077312 A1 | 3/2022 | Hoshi | |
| 2022/0293724 A1* | 9/2022 | Saito .................. | H10D 30/668 |
| 2024/0105820 A1 | 3/2024 | Motai et al. | |

* cited by examiner

SEMICONDUCTOR DEVICE

CROSS REFERENCE TO RELATED APPLICATION

This application is based on Japanese Patent Application No. 2022-184657 filed on Nov. 18, 2022, the disclosure of which is incorporated herein by reference.

TECHNICAL FIELD

The present disclosure relates to a semiconductor device.

BACKGROUND

A semiconductor device includes a semiconductor layer constructed of an element region in which an element structure is formed and a termination region located around the element region.

SUMMARY

According to an aspect of the present disclosure, a semiconductor device includes a semiconductor layer having an element region in which an element structure is formed and a termination region located around the element region. The semiconductor layer located in the termination region includes: a drift region of a first conductivity; a plurality of lower guard rings of a second conductivity provided in a first depth range surrounded by the drift region; and a plurality of upper guard rings of a second conductivity provided in a second depth range different from the first depth range and surrounded by the drift region. The plurality of lower guard rings extend around the element region in a plan view of the semiconductor layer, and are spaced from each other in a predetermined direction connecting the element region and the termination region. The plurality of upper guard rings extend around the element region in a plan view of the semiconductor layer, and are spaced from each other in the predetermined direction. Each of the plurality of lower guard rings has a lower inner peripheral surface facing the element region and a lower outer peripheral surface opposite to the lower inner peripheral surface. Each of the plurality of upper guard rings has an upper inner peripheral surface facing the element region and an upper outer peripheral surface opposite to the upper inner peripheral surface. An upper portion of each of the plurality of lower guard rings overlaps a lower portion of a corresponding one of the plurality of upper guard rings. The lower inner peripheral surface of each of the plurality of lower guard rings is offset to one side in the predetermined direction with respect to the upper inner peripheral surface of a corresponding one of the plurality of upper guard rings. The lower outer peripheral surface of each of the plurality of lower guard rings is offset to the one side in the predetermined direction with respect to the upper outer peripheral surface of a corresponding one of the plurality of upper guard rings. A center line of each of the plurality of lower guard rings extends in parallel with and not to intersect a center line of a corresponding one of the plurality of upper guard rings in a plan view of the semiconductor layer.

BRIEF DESCRIPTION OF DRAWINGS

FIG. 2 is a schematic sectional view of the semiconductor device of the first embodiment, taken along a line II-II in FIG. 1.

FIG. 5 is a schematic sectional view of a semiconductor device according to a second embodiment, taken along a line II-II in FIG. 1.

FIG. 6 is a schematic sectional view of a semiconductor device according to a third embodiment, taken along a line II-II in FIG. 1.

FIG. 7 is a schematic sectional view of a semiconductor device according to a fourth embodiment, taken along a line II-II in FIG. 1.

FIG. 8 is a schematic sectional view of a semiconductor device according to a fifth embodiment, taken along a line II-II in FIG. 1.

FIG. 9 is a schematic sectional view of a semiconductor device according to a sixth embodiment, taken along a line II-II in FIG. 1.

DETAILED DESCRIPTION

Figure 1:
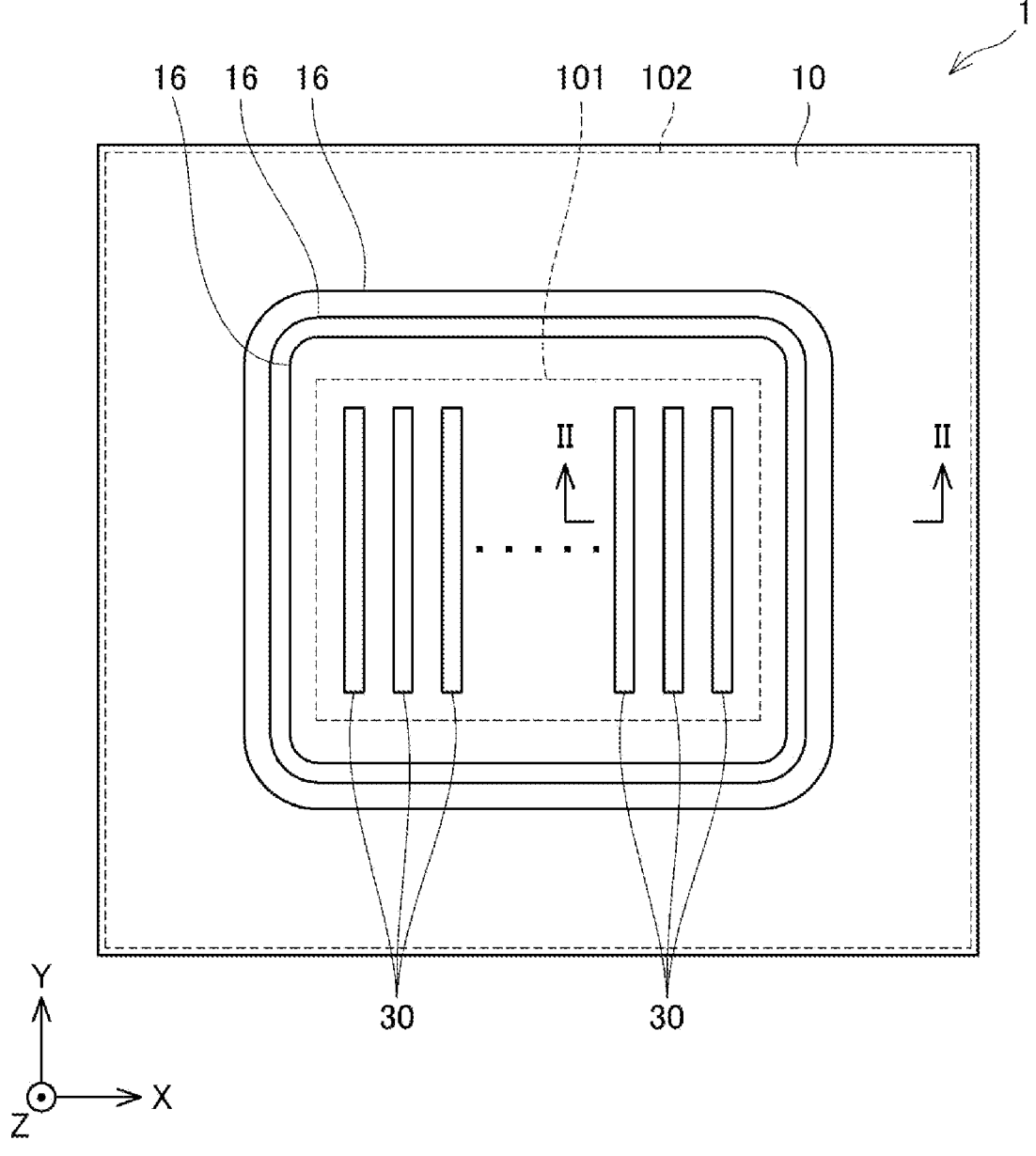
FIG. 1 is a schematic plan view illustrating a semiconductor device according to a first embodiment, in a state where a structure on a semiconductor layer is removed, to show a layout of trench gates and guard rings.

A semiconductor device includes a semiconductor layer having an element region in which an element structure is formed and a termination region located around the element region. A structure for ensuring the breakdown voltage of the semiconductor device is provided in the termination region of the semiconductor layer. A semiconductor device includes plural p-type guard rings as a breakdown voltage structure.

When the semiconductor device is turned off, a depletion layer spreads from the element region to the termination region. The depletion layer spreads from the inner peripheral side toward the outer peripheral side of the termination region via the guard rings. Since the depletion layer spreading from the element region largely spreads from the inner peripheral side toward the outer peripheral side of the termination region, the breakdown voltage of the semiconductor device is improved.

In this type of semiconductor device, it is desired to increase the concentration of the drift region in order to reduce the loss. In order to satisfactorily widen the depletion layer in the semiconductor device provided with the high concentration drift region, it is necessary to narrow the interval between the guard rings adjacent to each other. The present specification provides a technique capable of narrowing an interval between adjacent guard rings.

According to an aspect of the present disclosure, a semiconductor device includes a semiconductor layer having an element region in which an element structure is formed and a termination region located around the element region. The semiconductor layer located in the termination region includes: a drift region of a first conductivity; a plurality of lower guard rings of a second conductivity provided in a first depth range surrounded by the drift region; and a plurality of upper guard rings of a second conductivity provided in a second depth range different from the first depth range and surrounded by the drift region. The plurality of lower guard rings extend around the element region in a plan view of the semiconductor layer, and are spaced from each other in a predetermined direction connecting the element region and the termination region. The plurality of upper guard rings extend around the element region in a plan view of the semiconductor layer, and are spaced from each other in the predetermined direction. Each of the plurality of lower guard rings has a lower inner peripheral surface facing the element region and a lower outer peripheral surface opposite to the lower inner peripheral surface. Each of the plurality of upper guard rings has an upper inner peripheral surface facing the element region and an upper outer peripheral surface opposite to the upper inner peripheral surface. An upper portion of each of the plurality of lower guard rings overlaps a lower portion of a corresponding one of the plurality of upper guard rings. The lower inner peripheral surface of each of the plurality of lower guard rings is offset to one side in the predetermined direction with respect to the upper inner peripheral surface of a corresponding one of the plurality of upper guard rings. The lower outer peripheral surface of each of the plurality of lower guard rings is offset to the one side in the predetermined direction with respect to the upper outer peripheral surface of a corresponding one of the plurality of upper guard rings. A center line of each of the plurality of lower guard rings extends in parallel with and not to intersect a center line of a corresponding one of the plurality of upper guard rings in a plan view of the semiconductor layer.

In the semiconductor device, since the relative positions of the lower guard rings and the upper guard rings are offset in the predetermined direction, the minimum interval between the lower guard ring and the upper guard ring adjacent to each other can be made smaller than the minimum processing dimension.

Hereinafter, embodiments will be described with reference to the drawings. Constituent elements that are substantially common throughout the embodiments are denoted by common reference numerals, and description thereof is omitted. In addition, for the purpose of clarity of illustration, only some of the repeatedly arranged components may be denoted by reference numerals.

First Embodiment

Figure 2:
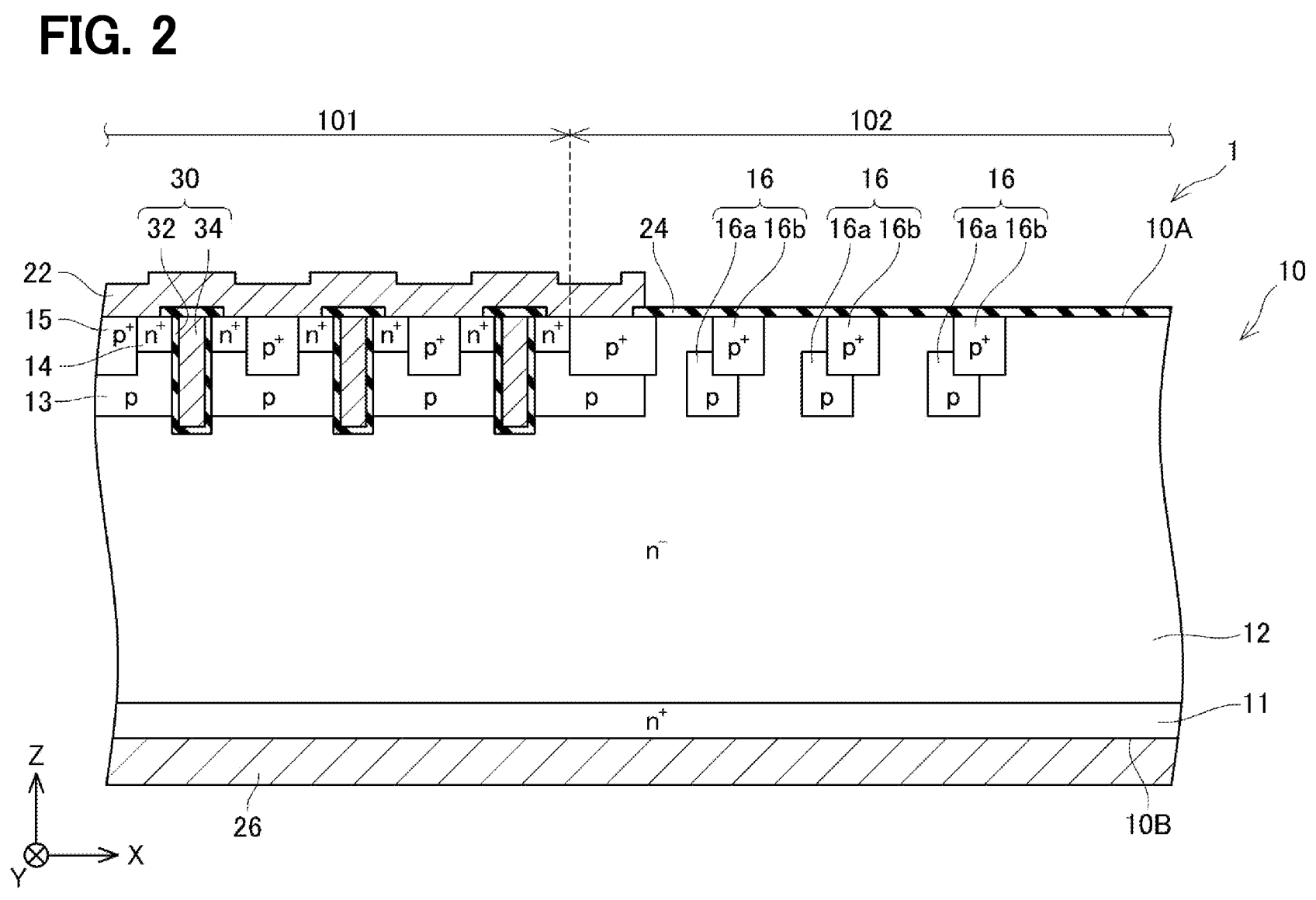

As shown in FIGS. 1 and 2, a semiconductor device 1 includes a semiconductor layer 10, a source electrode 22, an interlayer insulating film 24, a drain electrode 26 and plural trench insulating gates 30. The source electrode 22 covers a part of the upper surface 10A of the semiconductor layer 10. The interlayer insulating film 24 covers a part of the upper surface 10A of the semiconductor layer 10. The drain electrode 26 covers the entire surface of the lower surface 10B of the semiconductor layer 10. The semiconductor device 1 is a vertical metal-oxide-semiconductor field effect transistor (MOSFET) and is used as a power semiconductor device. As shown in FIG. 2, the source electrode 22 and the interlayer insulating film 24 are disposed on the upper surface 10A of the semiconductor layer 10. However, these components are omitted in FIG. 1.

The semiconductor layer 10 is not particularly limited, but may be made of, for example, silicon carbide (SiC). The semiconductor layer 10 includes an element region 101 and a termination region 102. As shown in FIG. 1, the element region 101 is arranged in the central portion of the semiconductor layer 10, when viewed in the Z direction orthogonal to the upper surface 10A of the semiconductor layer 10, in other words, when the semiconductor layer 10 is viewed in a plan view. A switching element structure such as MOSFET structure is formed in the element region 101 of the semiconductor layer 10. The termination region 102 is positioned in a peripheral portion of the semiconductor layer 10, around the element region 101, when the semiconductor layer 10 is viewed in a plan view. A breakdown voltage structure (in this embodiment, guard rings 16) are formed in the termination region 102 of the semiconductor layer 10.

As shown in FIG. 2, the semiconductor layer 10 includes an n+ drain region 11, an n– drift region 12, a p-type body region 13, plural n+ source regions 14, plural p+ body contact regions 15, and plural p+ guard rings 16. In this embodiment, the plural guard rings 16 are constituted by three guard rings 16, but the number of guard rings may be modified. The guard ring 16 is also referred to as a field limiting ring (FLR). The body region 13, the source regions 14, and the body contact regions 15 are selectively formed in a surface layer portion of the element region 101. The guard rings 16 are selectively formed in a surface layer portion of the termination region 102. In this embodiment, the boundary between the element region 101 and the termination region 102 is defined by the peripheral edge of the outermost source region 14 of the source regions 14.

The drain region 11 is disposed in a back layer portion of the semiconductor layer 10 relative to both the element region 101 and the termination region 102, and is provided at a position exposed to the lower surface 10B of the semiconductor layer 10. The drain region 11 contains an n-type impurity (such as nitrogen or phosphorus, etc.) at a high concentration, and is in ohmic contact with the drain electrode 26 covering the lower surface 10B of the semiconductor layer 10.

The drift region 12 is disposed on the drain region 11 relative to both the element region 101 and the termination region 102. The n-type impurity concentration of the drift region 12 is lower than the n-type impurity concentration of the drain region 11.

The body region 13 is disposed on the drift region 12 and located in the element region 101. The body region 13 is provided in the surface layer portion of the semiconductor layer 10. The body region 13 is not particularly limited, but may be formed by introducing a p-type impurity (such as aluminum, boron, or the like) into the surface layer portion of the semiconductor layer 10 using, for example, an ion implantation technique.

The source region 14 is disposed on the body region 13 and located in the element region 101. The source region 14 is provided at a position exposed to the upper surface 10A of the semiconductor layer 10. The source region 14 is separated from the drift region 12 by the body region 13. Although not particularly limited, the source region 14 may be formed by introducing an n-type impurity into the surface layer portion of the semiconductor layer 10 using, for example, an ion implantation technique. The source region 14 contains an n-type impurity at a high concentration and is in ohmic contact with the source electrode 22 covering the upper surface 10A of the semiconductor layer 10.

The body contact region 15 is disposed on the body region 13 and located in the element region 101. The body contact region 15 is provided at a position exposed to the upper surface 10A of the semiconductor layer 10. The body contact region 15 is not particularly limited, but may be formed by introducing a p-type impurity into the surface layer portion of the semiconductor layer 10 using, for example, an ion implantation technique. The body contact region 15 contains a high concentration of p-type impurities and is in ohmic contact with the source electrode 22 covering the upper surface 10A of the semiconductor layer 10.

As shown in FIG. 1, plural trench insulating gates 30 are formed on the upper surface 10A of the semiconductor layer 10 in a stripe shape, within a range corresponding to the element region 101, in a plan view of the semiconductor layer 10. Each of the trench insulating gates 30 extends along one direction (Y direction). As shown in FIG. 2, each of the trench insulating gates 30 has a gate insulating film 32 made of silicon oxide and a gate electrode 34 made of polysilicon. The gate electrode 34 faces a portion of the body region 13 separating the drift region 12 and the source region 14 via the gate insulating film 32. As a result, the portion of the body region 13 separating the drift region 12 and the source region 14 can function as a channel region.

As described above, a MOSFET structure including the drain region 11, the drift region 12, the body region 13, the source region 14, the body contact region 15, and the trench insulating gate 30 is formed in the element region 101 of the semiconductor layer 10. A breakdown voltage structure including the guard rings 16 is formed in the termination region 102 of the semiconductor layer 10.

Figure 3:
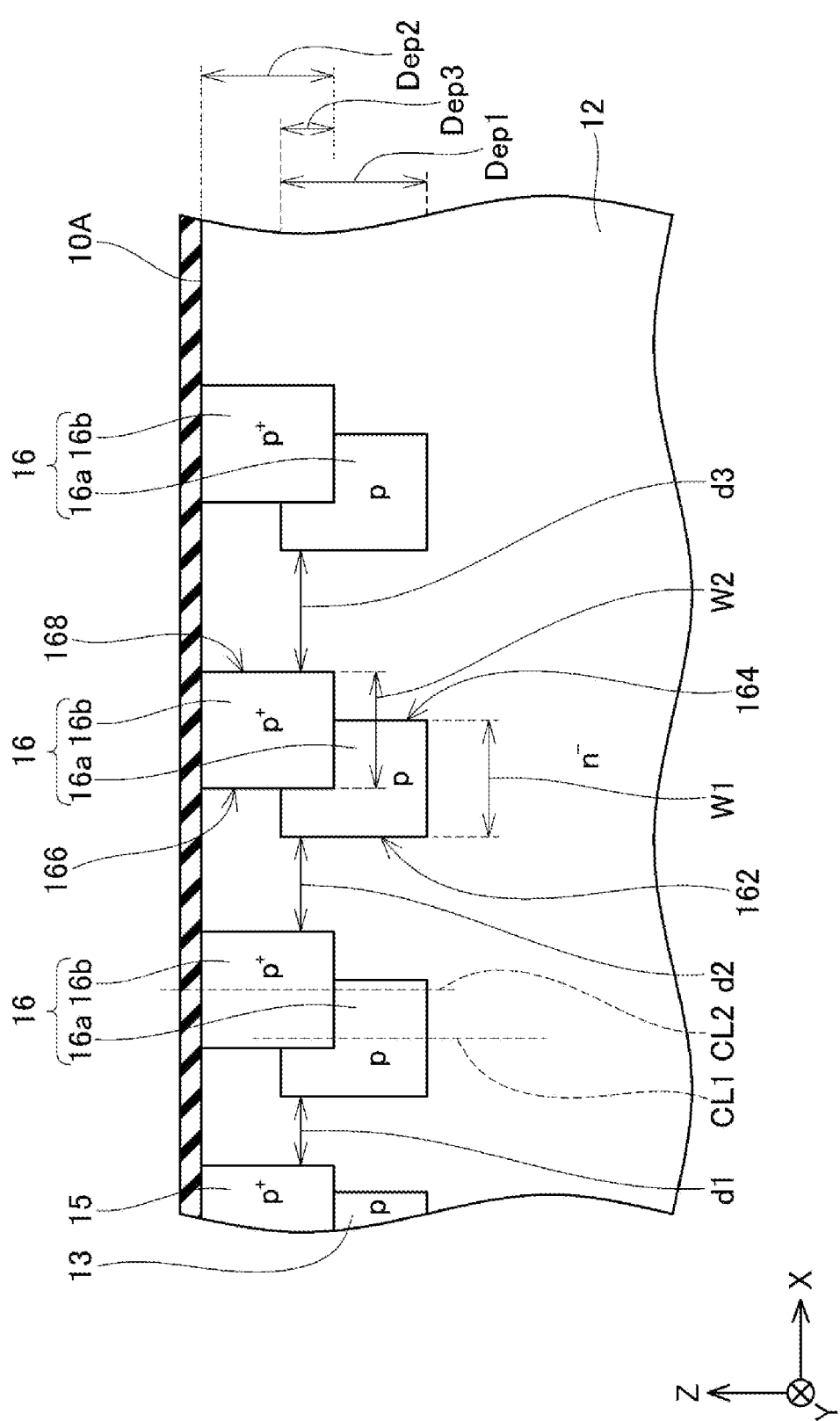
FIG. 3 is a schematic enlarged sectional view illustrating the guard rings.

As shown in FIGS. 2 and 3, the guard rings 16 are disposed on the drift region 12 and located in the termination region 102, at positions exposed to the upper surface 10A of the semiconductor layer 10. The potential of each of the guard rings 16 is floating. As shown in FIG. 1, the guard rings 16 are provided so as to circulate around the element region 101 in a plan view of the semiconductor layer 10. In this manner, the guard rings 16 are arranged at intervals from each other in a predetermined direction (the X direction in FIGS. 2 and 3) connecting the element region 101 and the termination region 102.

The guard ring 16 includes lower guard rings 16a and upper guard rings 16b. Each of the guard rings 16 includes one lower guard ring 16a and one upper guard ring 16b.

As shown in FIG. 3, the lower guard rings 16a are surrounded by the drift region 12 and provided in the first depth range Dep1 of the semiconductor layer 10. The first depth range Dep1 is a depth range away from the upper surface 10A of the semiconductor layer 10. Each of the lower guard rings 16a extends around the element region 101 in a plan view of the semiconductor layer 10, and the lower guard rings 16a are disposed at intervals from each other in the predetermined direction. The lower guard rings 16a have a similar shape concentric with each other when the semiconductor layer 10 is viewed in a plan view. Each of the lower guard rings 16a has a lower inner peripheral surface 162 facing the element region 101 and a lower outer peripheral surface 164 opposite to the lower inner peripheral surface 162. The width W1 of each of the lower guard rings 16a measured between the lower inner peripheral surface 162 and the lower outer peripheral surface 164 in the predetermined direction is not particularly limited, but may be common to the lower guard rings 16a. The lower guard ring 16a is formed by introducing a p-type impurity into the surface layer portion of the semiconductor layer 10 using an ion implantation technique. In this example, the lower guard ring 16a and the body region 13 are formed by ion implantation using a common mask.

The upper guard rings 16b are surrounded by the drift region 12 and provided in the second depth range Dep2 of the semiconductor layer 10. The second depth range Dep2 is different from the first depth range Dep1, and is defined from the upper surface 10A of the semiconductor layer 10 to a predetermined depth. The second depth range Dep2 may be defined as a depth range away from the upper surface 10A of the semiconductor layer 10. Each of the upper guard rings 16b extends around the element region 101 in a plan view of the semiconductor layer 10, and the upper guard rings 16b are disposed at intervals from each other in the predetermined direction. Each of the upper guard rings 16b has a similar shape concentric with the other upper guard rings

16b when the semiconductor layer 10 is viewed in a plan view. Each of the upper guard rings 16b has an upper inner peripheral surface 166 facing the element region 101 and an upper outer peripheral surface 168 opposite to the upper inner peripheral surface 166. The width W2 of each of the upper guard rings 16b measured between the upper inner peripheral surface 166 and the upper outer peripheral surface 168 in the predetermined direction is not particularly limited, but may be common to the upper guard rings 16b. The width W1 of the lower guard ring 16a and the width W2 of the upper guard ring 16b may be the same. The upper guard ring 16b is formed by introducing a p-type impurity into the surface layer portion of the semiconductor layer 10 using an ion implantation technique. In this example, the upper guard ring 16b and the body contact region 15 are formed by ion implantation using a common mask.

An upper portion of each of the lower guard rings 16a overlaps a lower portion of a corresponding one of the upper guard rings 16b. In other words, the top surface of each of the lower guard rings 16a is present above the bottom surface of the corresponding one of the upper guard rings 16b, that is, at a shallow position of the semiconductor layer 10. In this way, the upper portion of the first depth range Dep1 in which the lower guard ring 16a is present and the lower portion of the second depth range Dep2 in which the upper guard ring 16b is present overlap each other within a third depth range Dep3.

The lower inner peripheral surface 162 of each of the of lower guard rings 16a is offset to one side in the predetermined direction with respect to the upper inner peripheral surface 166 of the corresponding one of the upper guard rings 16b. In this example, the lower inner peripheral surface 162 of each of the lower guard rings 16a is offset, relative to the upper inner peripheral surface 166 of the corresponding one of the upper guard rings 16b, toward the element region 101 in the predetermined direction.

The lower outer peripheral surface 164 of each of the lower guard rings 16a is offset to one side in the predetermined direction with respect to the upper outer peripheral surface 168 of the corresponding one of the upper guard rings 16b. In this example, the lower outer peripheral surface 164 of each of the lower guard rings 16a is offset, relative to the upper outer peripheral surface 168 of the corresponding one of the upper guard rings 16b, toward the element region 101 in the predetermined direction.

Figure 4:
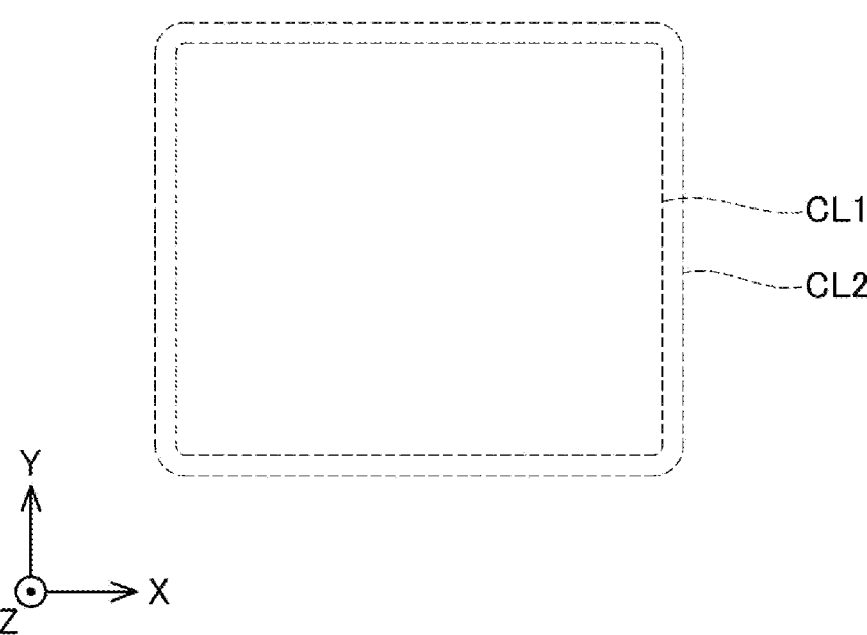
FIG. 4 is a diagram in which a center line of a lower guard ring and a center line of an upper guard ring run in parallel.

A line passing through the center of each of the lower guard rings 16a in the predetermined direction is referred to as a center line CL1, and a line passing through the center of each of the upper guard rings 16b in the predetermined direction is referred to as a center line CL2. As shown in FIG. 4, the center line CL1 of the lower guard ring 16a extends parallel to the center line CL2 of the upper guard ring 16b and does not intersect with the center line CL2 of the upper guard ring 16b when the semiconductor layer 10 is viewed in a plan view. In FIG. 4, only the center line CL1 of the lower guard ring 16a and the center line CL2 of the upper guard ring 16b constituting one of the guard rings 16 are illustrated, but the same applies to the other guard rings 16. As described above, the lower guard ring 16a and the upper guard ring 16b constituting one guard ring 16 are diffusion regions intentionally formed in different patterns, and are offset beyond a range of a manufacturing error when the center line CL1 and the center line CL2 are formed to coincide with each other.

As shown in FIG. 3, between the adjacent guard rings 16, a minimum interval d2, d3 is formed between the lower inner peripheral surface 162 of the lower guard ring 16a and the upper outer peripheral surface 168 of the upper guard ring 16b. The minimum interval d3 is larger than the minimum interval d2. In this example, three guard rings 16 are provided. In case where an additional guard ring 16 is provided on the outer peripheral side of the termination region 102, the minimum interval formed by the additional guard ring 16 is larger than the minimum interval d2, d3. As described above, the lower guard rings 16a and the upper guard rings 16b are configured such that the minimum interval between the lower guard ring 16a and upper guard ring 16b adjacent to each other increases in order from the inner peripheral side toward the outer peripheral side of the termination region 102.

The minimum interval d1 between the lower guard ring 16a at the innermost periphery of the termination region 102 and the p-type region (in this example, the body contact region 15) of the element region 101 is smaller than the minimum interval d2. As described above, in the semiconductor device 1, the relationship d1<d2<d3 is established.

Next, the operation of the semiconductor device 1 will be described. During the operation of the semiconductor device 1, a voltage is applied between the drain and the source so that the potential of the drain electrode 26 becomes higher than the potential of the source electrode 22. When the voltage between the gate electrode 34 and the source electrode 22 becomes higher than the threshold value, a channel is formed in the body region 13 within a range in contact with the gate insulating film 32. Then, electrons flow from the source electrode 22 to the drain electrode 26 via the source region 14, the channel, the drift region 12, and the drain region 11. When the voltage between the gate electrode 34 and the source electrode 22 becomes equal to or lower than the threshold value, the channel disappears and the flow of electrons stops. Thus, the semiconductor device 1 can control the current flowing between the source electrode 22 and the drain electrode 26 based on the voltage between the gate electrode 34 and the source electrode 22.

When the semiconductor device 1 is turned off, a depletion layer spreads in the drift region 12 from a pn junction surface of the drift region 12 and the body region 13. In the drift region 12 of the element region 101, the depletion layer spreads from the upper surface 10A toward the lower surface 10B. In the drift region 12 of the termination region 102, the depletion layer spreads from the inner peripheral side to the outer peripheral side. In the semiconductor device 1, since the guard rings 16 are provided in the termination region 102, the depletion layer spreading from the element region 101 can largely spread from the inner peripheral side toward the outer peripheral side of the termination region 102 via the guard rings 16. Specifically, when the depletion layer spreading from the guard ring 16 located at the innermost periphery of the termination region 102 reaches the adjacent guard ring 16, the depletion layer starts to spread from the guard ring 16. In this manner, the depletion layer spreading from the element region 101 spreads from the inner peripheral side toward the outer peripheral side of the termination region 102 via the guard rings 16 in order.

In the semiconductor device 1, it is desired to increase the concentration of the drift region 12 in order to reduce the loss. However, when the concentration of the drift region 12 is increased, it is necessary to narrow the interval between the adjacent guard rings 16 in order to expand the depletion layer through the guard rings 16 in order. In the semiconductor device 1, since the relative positions of the lower guard ring 16a and the upper guard ring 16b are offset in the predetermined direction, the minimum interval between the lower guard ring 16a and upper guard ring 16b adjacent to each other can be made smaller than the minimum processing dimension. Thus, the semiconductor device 1 can achieve both low loss and high breakdown voltage.

In the semiconductor device 1, the lower guard rings 16a are formed so as to be offset, relative to the upper guard rings 16b, toward the element region 101 in the predetermined direction. In this case, the equipotential line formed in the termination region 102 including the guard rings 16, when the semiconductor device 1 is turned off, has a curvature larger than that in a case where the lower guard rings 16a are formed to be offset toward the termination region 102 in the predetermined direction with respect to the upper guard rings 16b. Therefore, electric field concentration can be suppressed, and the semiconductor device 1 can have high breakdown voltage characteristics.

In the semiconductor device 1, the minimum interval between the lower guard ring 16a and the upper guard ring 16b adjacent to each other is configured to increase in order from the inner peripheral side toward the outer peripheral side of the termination region 102. In the semiconductor device 1, the guard rings 16 adjacent to each other in the predetermined direction, on the outer peripheral side of the termination region 102, can be separated from each other while the guard rings 16 adjacent to each other in the predetermined direction, on the inner peripheral side of the termination region 102, are connected to each other due to manufacturing variations. Therefore, in the semiconductor device 1, a decrease in breakdown voltage caused by the coupling between the guard rings 16 due to manufacturing variations is suppressed.

In the semiconductor device 1, it is possible to secure a wide interval between the adjacent upper guard rings 16b while narrowing the minimum interval between the lower guard ring 16a and the upper guard ring 16b adjacent to each other. Therefore, the charge amount (that is, concentration× depth) of the n-type region to be depleted can be secured between the adjacent upper guard rings 16b, so that excessive spreading of the depletion layer can be suppressed. Therefore, the semiconductor device 1 can have high breakdown voltage characteristics while suppressing an increase in the area of the termination region 102.

In the semiconductor device 1, the lower guard rings 16a are formed in the same ion implantation process as the body region 13, and the upper guard rings 16b are formed in the same ion implantation process as the body contact region 15. Since a dedicated ion implantation process for forming the guard rings 16 is not required, the semiconductor device 1 can be manufactured at low manufacturing cost.

Second Embodiment

Figure 5:
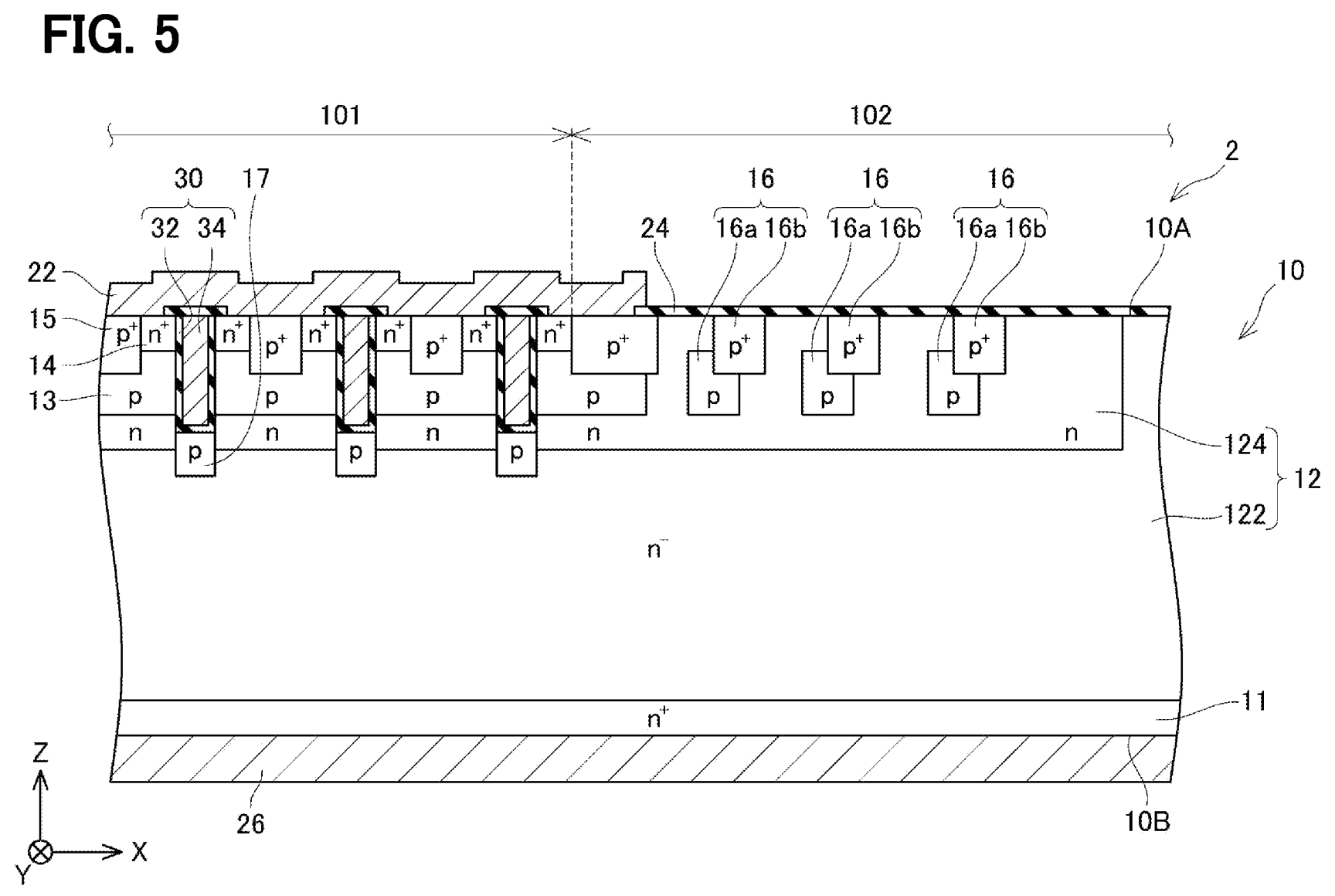

As shown in FIG. 5, the semiconductor device 2 of the present embodiment includes a p-type electric field relaxation region 17 in contact with the bottom surface of the trench insulating gate 30. The electric field relaxation region 17 can relax electric field concentration on the bottom surface of the trench insulating gate 30. In the semiconductor device 2 of the present embodiment, the drift region 12 includes a low concentration drift region 122 and a high concentration drift region 124. The low concentration drift region 122 is disposed between the drain region 11 and the high concentration drift region 124. The high concentration drift region 124 is disposed on the upper side of the low concentration drift region 122, and has the concentration of the n-type impurity higher than that of the low concentration drift region 122.

The high concentration drift region 124 located in the element region 101 is disposed between the low concentration drift region 122 and the body region 13, and extends between the adjacent trench insulating gates 30. The electric field relaxation region 17 is provided so as to penetrate the high concentration drift region 124 and reach the low concentration drift region 122. The high concentration drift region 124 located in the element region 101 functions as a current dispersion region, and can suppress an increase in resistance due to the JFET effect caused by the electric field relaxation region 17.

The high concentration drift region 124 located in the termination region 102 is arranged so as to surround the guard rings 16. It is generally known that positive charges are accumulated in the interlayer insulating film 24 located in the termination region 102. Such a variation in the accumulation amount of the positive charge changes the breakdown voltage characteristics. In the semiconductor device 2, the high concentration drift region 124 is provided so as to surround the guard rings 16. If the high concentration drift region 124 is depleted, positive charges are charged in the high concentration drift region 124. In the semiconductor device 2, since the high concentration drift region 124 is formed at a high concentration, the amount of positive charge when depleted is also large. Accordingly, even if there is a variation in the amount of positive charge in the interlayer insulating film 24, the influence thereof can be relatively reduced by the amount of positive charge charged in the high concentration drift region 124.

Third Embodiment

Figure 6:
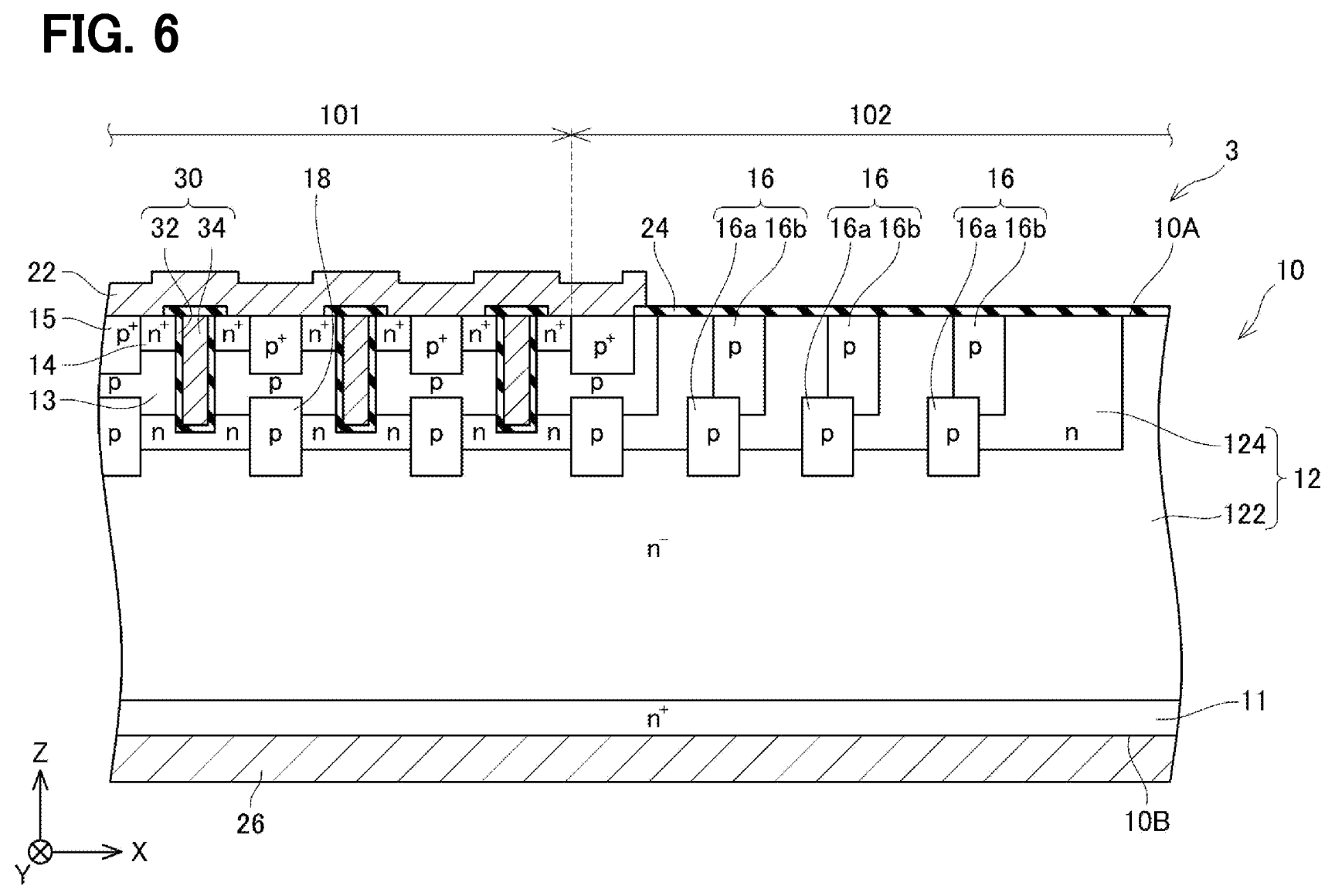

As shown in FIG. 6, the semiconductor device 3 of the present embodiment includes a p-type electric field relaxation region 18 provided so as to protrude downward from the body region 13 between the adjacent trench insulating gates 30. The electric field relaxation region 18 is disposed away from the side surface of the trench insulating gate 30. The electric field relaxation region 18 is provided so as to penetrate the high concentration drift region 124 and reach the low concentration drift region 122. The electric field relaxation region 18 can relax electric field concentration on the bottom surface of the trench insulating gate 30.

In the semiconductor device 3, the lower guard rings 16a are formed in the same ion implantation process as the electric field relaxation region 18, and the upper guard rings 16b are formed in the same ion implantation process as the body region 13. Since a dedicated ion implantation process for forming the guard rings 16 is not required, the semiconductor device 3 can be manufactured at low manufacturing cost.

Fourth Embodiment

Figure 7:
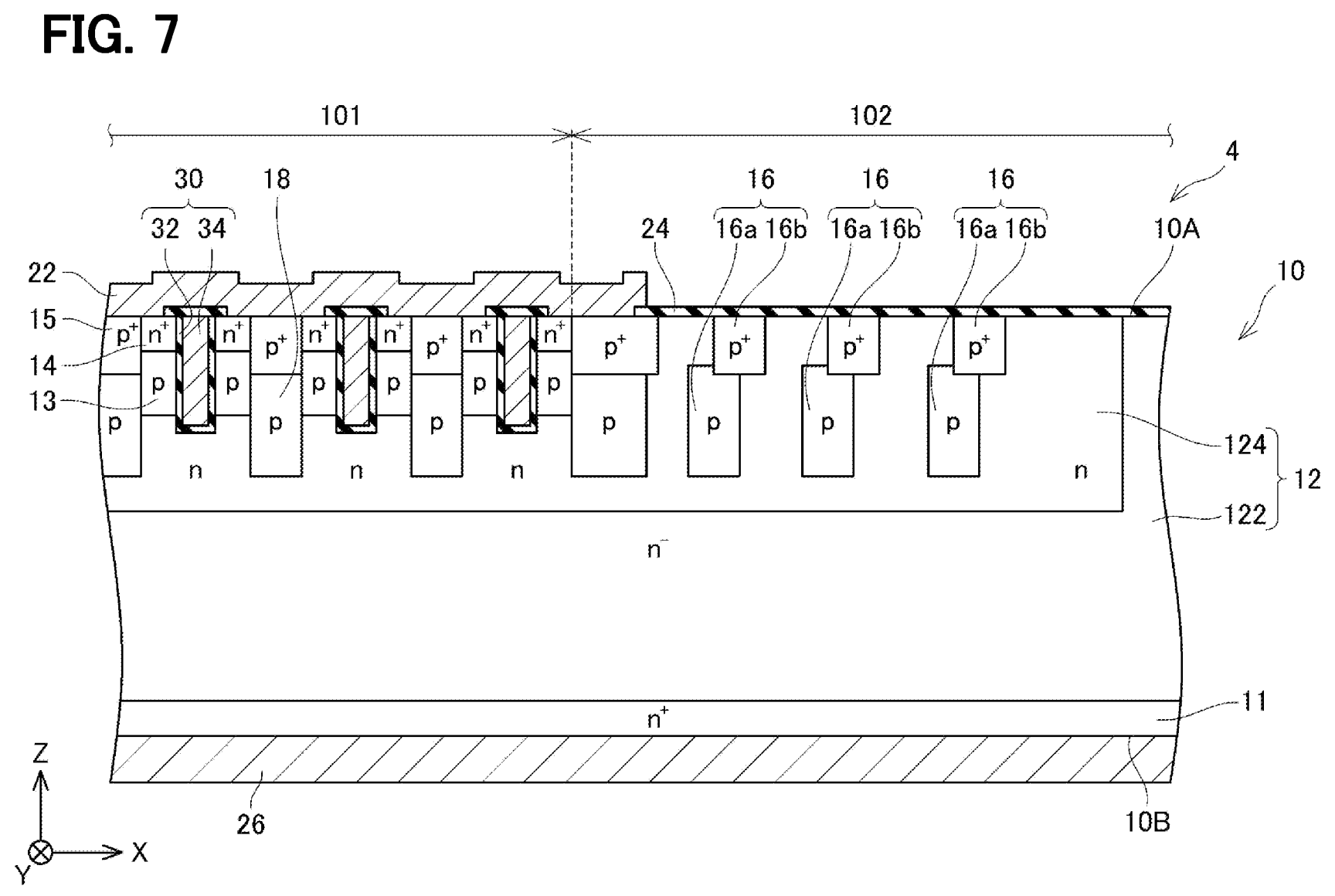

As shown in FIG. 7, in the semiconductor device 4 of the present embodiment, the high concentration drift region 124 is formed so as to surround the electric field relaxation region 18. The high concentration drift region 124 functions as a current dispersion region, and an increase in resistance due to the JFET effect caused by the electric field relaxation region 18 can be suppressed.

In the semiconductor device 4, the lower guard rings 16a are formed in the same ion implantation process as the electric field relaxation region 18, and the upper guard rings 16b are formed in the same ion implantation process as the body contact region 15. Since a dedicated ion implantation process for forming the guard rings 16 is not required, the semiconductor device 4 can be manufactured at low manufacturing cost.

Fifth Embodiment

Figure 8:
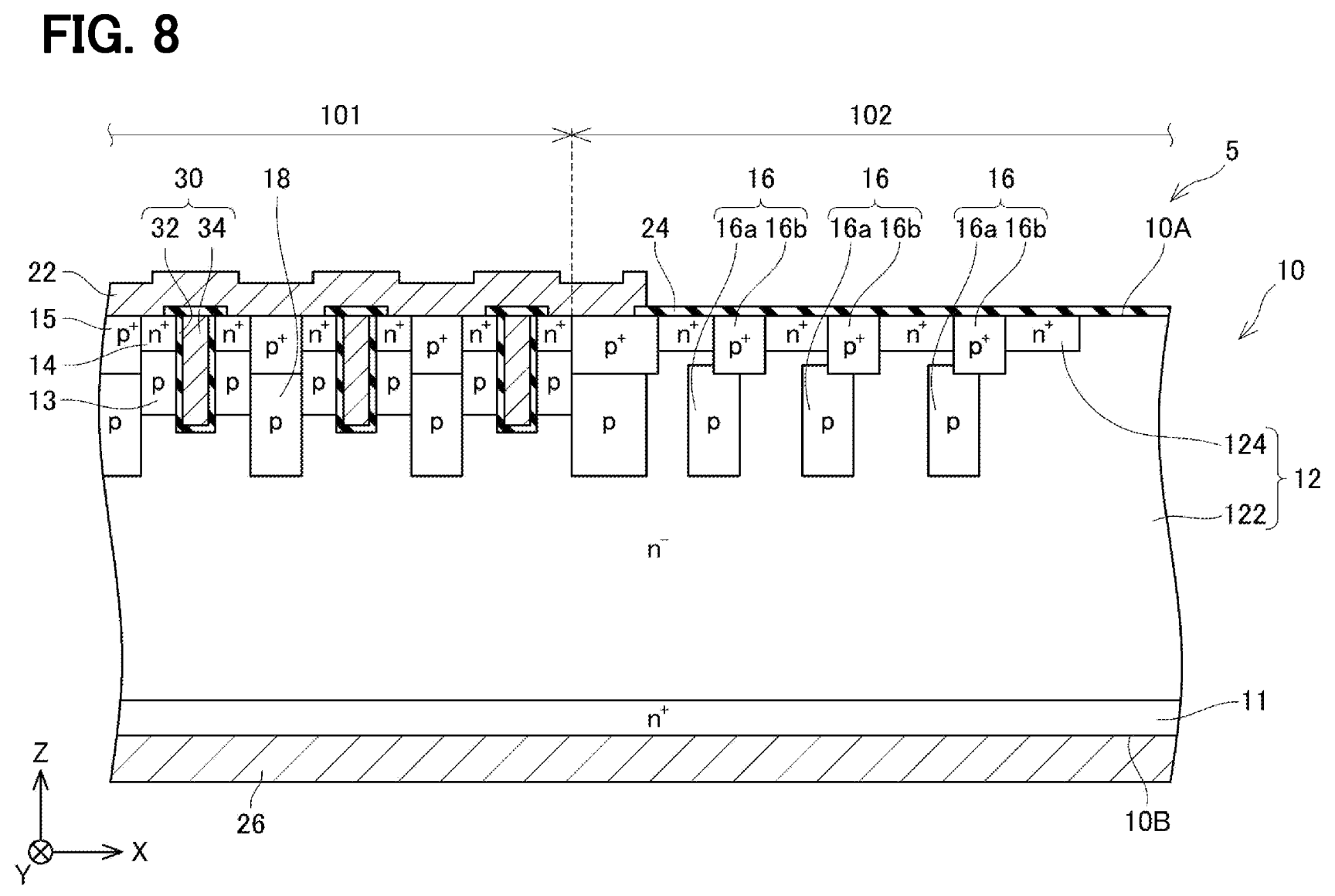

As shown in FIG. 8, in the semiconductor device 5 of the present embodiment, the high concentration drift region 124 is formed only in a part of the depth range of the upper guard rings 16b and exposed to the upper surface 10A of the semiconductor layer 10. Also in this example, similarly to the above, the influence of the variation in the amount of positive charge in the interlayer insulating film 24 can be suppressed. Since the high concentration drift region 124 is not provided at position where the interval between the lower guard ring 16a and upper guard ring 16b adjacent to each other is the minimum, the depletion layer can be satisfactorily spread when the semiconductor device 1 is turned off.

In the semiconductor device 5, the lower guard rings 16a are formed in the same ion implantation process as the electric field relaxation region 18, and the upper guard rings 16b are formed in the same ion implantation process as the body contact region 15. Further, the high concentration drift region 124 is formed in the same ion implantation process as the source region 14. Since a dedicated ion implantation process for forming the guard rings 16 and the high concentration drift region 124 is not required, the semiconductor device 5 can be manufactured at a low manufacturing cost. Note that the high concentration drift region 124 and the source region 14 may be formed in the same step using a crystal growth technique instead of the ion implantation step.

Sixth Embodiment

Figure 9:
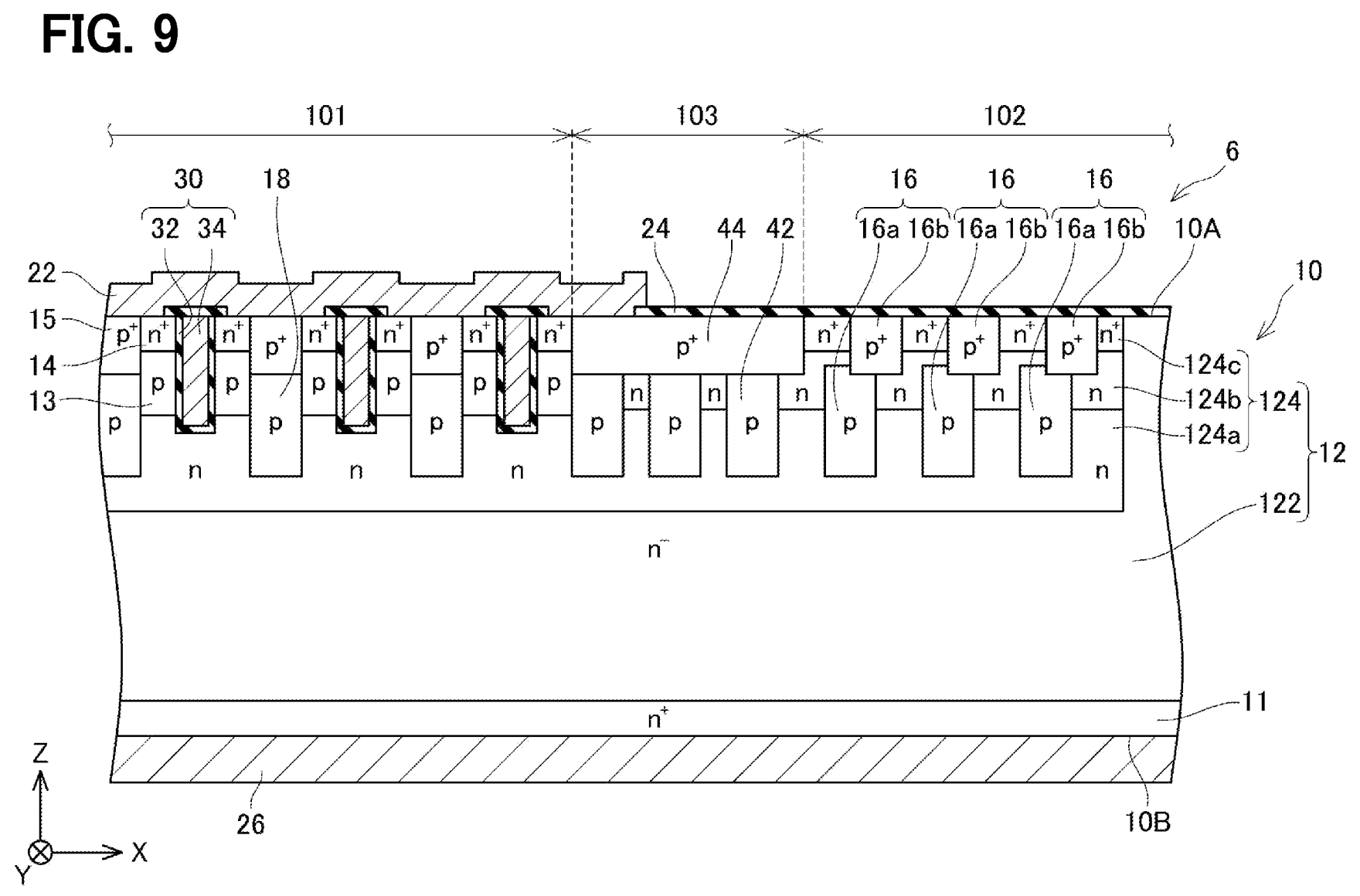

As shown in FIG. 9, in the semiconductor device 6 of the present embodiment, the semiconductor layer 10 further includes a connection region 103 between the element region 101 and the termination region 102. Plural lower connecting p-type regions 42 are formed in the connection region 103 by the same ion implantation process as the electric field relaxation region 18 of the element region 101 and the lower guard rings 16a of the termination region 102. Each of the lower connecting p-type regions 42 extends around the element region 101 in a plan view of the semiconductor layer 10, and the lower connecting p-type regions 42 are disposed at intervals from each other in the predetermined direction. The connection region 103 is further provided with an upper connection p-type region 44 formed in the same ion implantation process as the body contact region 15 of the element region 101 and the upper guard rings 16b of the termination region 102. The upper connecting p-type region 44 extends around the element region 101 when the semiconductor layer 10 is viewed in a plan view, and is formed to be wide in the predetermined direction. Due to the connection region 103, the electrical resistance is reduced when holes generated by avalanche flow in the lateral direction.

In the semiconductor device 6 of the present embodiment, the high concentration drift region 124 further includes a lower layer 124a, an intermediate layer 124b, and an upper layer 124c. The intermediate layer 124b is disposed in a depth range between the lower layer 124a and the upper layer 124c. The intermediate layer 124b is disposed so as to include a portion (corresponding to the third depth range Dep3 illustrated in FIG. 3) to be the minimum interval between the lower guard ring 16*a* and upper guard ring 16*b* adjacent to each other.

The high concentration drift region 124 having such a three-layer structure can disperse a current in the element region 101, suppress an influence of a variation in the amount of positive charges accumulated in the interlayer insulating film 24 of the termination region 102, and favorably spread the depletion layer when the semiconductor device 6 is turned off.

Although the embodiments have been described in detail above, these are merely examples and do not limit the scope of present disclosure. The techniques described in claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A semiconductor device, comprising
a semiconductor layer including an element region in which an element structure is formed and a termination region located around the element region, wherein
the semiconductor layer located in the termination region includes:
a drift region of a first conductivity;
a plurality of lower guard rings of a second conductivity provided in a first depth range surrounded by the drift region; and
a plurality of upper guard rings of the second conductivity provided in a second depth range different from the first depth range and surrounded by the drift region,
the plurality of lower guard rings extend around the element region in a plan view of the semiconductor layer, and are spaced from each other along a predetermined direction connecting the element region and the termination region,
the plurality of upper guard rings extend around the element region in a plan view of the semiconductor layer, and are spaced from each other along the predetermined direction,
each of the plurality of lower guard rings has a lower inner peripheral surface facing the element region and a lower outer peripheral surface opposite to the lower inner peripheral surface,
each of the plurality of upper guard rings has an upper inner peripheral surface facing the element region and an upper outer peripheral surface opposite to the upper inner peripheral surface,
an upper portion of the first depth range overlaps a lower portion of the second depth range within a third depth range,
the lower inner peripheral surface of each of the plurality of lower guard rings is offset to one side in the predetermined direction with respect to the upper inner peripheral surface of a corresponding one of the plurality of upper guard rings,
the lower outer peripheral surface of each of the plurality of lower guard rings is offset to the one side in the predetermined direction with respect to the upper outer peripheral surface of a corresponding one of the plurality of upper guard rings, and a center line of each of the plurality of lower guard rings extends in parallel with and not to intersect a center line of a corresponding one of the plurality of upper guard rings in a plan view of the semiconductor layer.

2. The semiconductor device according to claim 1, wherein a minimum interval between the lower guard ring and the upper guard ring adjacent to each other in the predetermined direction increases in order toward the termination region in the predetermined direction.

3. The semiconductor device according to claim 1, wherein
the lower inner peripheral surface of each of the plurality of lower guard rings is offset toward the element region in the predetermined direction, relative to the upper inner peripheral surface of a corresponding one of the plurality of upper guard rings, and
the lower outer peripheral surface of each of the plurality of lower guard rings is offset toward the element region in the predetermined direction, relative to the upper outer peripheral surface of a corresponding one of the plurality of upper guard rings.

4. The semiconductor device according to claim 1, wherein
the drift region includes:
a low concentration drift region; and
a high concentration drift region having an impurity concentration of the first conductivity higher than that of the low concentration drift region, wherein
the high concentration drift region is provided at an upper side of the low concentration drift region, and
the high concentration drift region is disposed at least between the upper guard rings adjacent to each other in the predetermined direction.

5. The semiconductor device according to claim 4, wherein the high concentration drift region is disposed between the lower guard rings adjacent to each other in the predetermined direction.

6. The semiconductor device according to claim 5, wherein
the high concentration drift region includes a lower layer, an intermediate layer, and an upper layer,
the intermediate layer has an impurity concentration of the first conductivity lower than that of the lower layer and the upper layer, and
the intermediate layer is located so as to include a depth range in which the first depth range and the second depth range overlap each other.

7. The semiconductor device according to claim 1, wherein the semiconductor layer is silicon carbide.

8. The semiconductor device according to claim 1, wherein a width of each of the lower guard rings between the lower inner peripheral surface and the lower outer peripheral surface in the predetermined direction is same as a width of each of the upper guard rings between the upper inner peripheral surface and the upper outer peripheral surface in the predetermined direction.

9. The semiconductor device according to claim 1, wherein the second depth range is located away from an upper surface (10A) of the semiconductor layer.

10. A semiconductor device, comprising
a semiconductor layer including an element region in which an element structure is formed and a termination region located around the element region, wherein
the semiconductor layer located in the termination region includes:
a drift region of a first conductivity;

US 12,696,480 B2

13 a plurality of lower guard rings of a second conductivity provided in a first depth range surrounded by the drift region; and a plurality of upper guard rings of the second conductivity provided in a second depth range different from the first depth range and surrounded by the drift region, the plurality of lower guard rings extend around the element region in a plan view of the semiconductor layer, and are spaced from each other along a predetermined direction connecting the element region and the termination region, the plurality of upper guard rings extend around the element region in a plan view of the semiconductor layer, and are spaced from each other along the predetermined direction, each of the plurality of lower guard rings has a lower inner peripheral surface facing the element region and a lower outer peripheral surface opposite to the lower inner peripheral surface, each of the plurality of upper guard rings has an upper inner peripheral surface facing the element region and an upper outer peripheral surface opposite to the upper inner peripheral surface, an upper portion of each of the plurality of lower guard rings overlaps a lower portion of a corresponding one of the plurality of upper guard rings, the lower inner peripheral surface of each of the plurality of lower guard rings is offset to one side in the predetermined direction with respect to the upper inner peripheral surface of a corresponding one of the plurality of upper guard rings,

14 the lower outer peripheral surface of each of the plurality of lower guard rings is offset to the one side in the predetermined direction with respect to the upper outer peripheral surface of a corresponding one of the plurality of upper guard rings, and a center line of each of the plurality of lower guard rings extends in parallel with and not to intersect a center line of a corresponding one of the plurality of upper guard rings in a plan view of the semiconductor layer, wherein the drift region includes:

a low concentration drift region; and a high concentration drift region having an impurity concentration of the first conductivity higher than that of the low concentration drift region, wherein the high concentration drift region is provided at an upper side of the low concentration drift region, and the high concentration drift region is disposed at least between the upper guard rings adjacent to each other in the predetermined direction, wherein the high concentration drift region is disposed between the lower guard rings adjacent to each other in the predetermined direction, wherein the high concentration drift region includes a lower layer, an intermediate layer, and an upper layer, the intermediate layer has an impurity concentration of the first conductivity lower than that of the lower layer and the upper layer, and the intermediate layer is located so as to include a depth range in which the first depth range and the second depth range overlap each other.

* * * * *